United States Patent
Liu et al.

(10) Patent No.: US 10,256,384 B2
(45) Date of Patent: Apr. 9, 2019

(54) LED SUPPORT FRAME AND LED DEVICE AND LED DISPLAY MODULE MANUFACTURED WITH THE SAME

(71) Applicant: FOSHAN NATIONSTAR OPTOELECTRONICS CO., LTD, Foshan, Guangdong (CN)

(72) Inventors: Chuanbiao Liu, Guangdong (CN); Kuai Qin, Guangdong (CN); Mingjun Zhu, Guangdong (CN); Xiaolong Huang, Guangdong (CN); Tinghong Yang, Guangdong (CN)

(73) Assignee: FOSHAN NATIONSTAR OPTOELECTRONICS CO., LTD, Foshan (CN)

( * ) Notice: Subject to any disclaimer, the term of this patent is extended or adjusted under 35 U.S.C. 154(b) by 0 days.

(21) Appl. No.: 15/764,319

(22) PCT Filed: Jun. 4, 2016

(86) PCT No.: PCT/CN2016/084882
§ 371 (c)(1),
(2) Date: Mar. 28, 2018

(87) PCT Pub. No.: WO2017/054500
PCT Pub. Date: Apr. 6, 2017

(65) Prior Publication Data
US 2018/0277726 A1    Sep. 27, 2018

(30) Foreign Application Priority Data

Sep. 30, 2015  (CN) .................. 2015 2 0764126 U (51) Int. Cl.
*H01L 29/18*  (2006.01)
*H01L 33/00*  (2010.01)
(Continued)

(52) U.S. Cl.
CPC ................ *H01L 33/60* (2013.01); *G09F 9/33* (2013.01); *H01L 33/486* (2013.01); *H01L 33/52* (2013.01); *H01L 33/58* (2013.01)

(58) Field of Classification Search
USPC ......... 257/88, 81, 82, 91, 98–100, 116, 117, 257/432–437, 749; 438/25–28, 51, 55,
(Continued)

(56) References Cited

U.S. PATENT DOCUMENTS

2004/0208210 A1* 10/2004 Inoguchi ............. H01L 25/0753
372/36
2011/0157891 A1*  6/2011 Davis ................ B29C 45/14467
362/244

(Continued)

FOREIGN PATENT DOCUMENTS

CN           1959982 A      5/2007

OTHER PUBLICATIONS

International Search Report of PCT Patent Application No. PCT/CN2016/084882 dated Sep. 7, 2016.

*Primary Examiner* — Niki H Nguyen (57) ABSTRACT

A light emitting diode (LED) support frame (10), LED device adopting the same, and LED display module. The LED support frame (10) comprises a base board (101) and a reflection cup (102). A light converging component (103) is arranged on the reflection cup (102). A concave light converging surface (1030) is provided at a side of the light converging component (103) and adjacent to a reflection cup mouth (1021). A part of a light beam emitted from an LED chip is directed to the light converging surface (1030), reflected by the light converging surface (1030), and finally converged with other light beams emitted from the LED chip to focus at a visual field observed by an observer. Therefore, the embodiment effectively reduces optical loss of lights
(Continued)

from different directions in the light converging component (103).

10 Claims, 5 Drawing Sheets (51) Int. Cl.
*H01L 33/60* (2010.01)
*G09F 9/33* (2006.01)
*H01L 33/48* (2010.01)
*H01L 33/52* (2010.01)
*H01L 33/58* (2010.01)

(58) Field of Classification Search
USPC .................................. 438/64–68, 83, 98
See application file for complete search history.

(56) References Cited

U.S. PATENT DOCUMENTS

| 2012/0104436 A1* | 5/2012 | Ng | H01L 33/58 |
| | | | 257/98 |
| 2016/0013382 A1* | 1/2016 | Ozeki | H01L 33/60 |
| | | | 257/98 |

\* cited by examiner

LED SUPPORT FRAME AND LED DEVICE AND LED DISPLAY MODULE MANUFACTURED WITH THE SAME

FIELD OF THE INVENTION

The present invention relates to the field of LED packaging, and in particular to LED support frame and LED device and LED display module manufactured with the same.

BACKGROUND OF THE INVENTION

With rapid development of display technology, outdoor display has been seen everywhere. The outdoor display generally comprises a plurality of LED pixels arranged in rows and columns, and the essential component of the LED pixel is an LED package device.

The LED package device generally includes a substrate, an LED chip fixed on the substrate, and a package body covering the LED chip. Generally, the outdoor display is used for hanging at a certain height. The light intensity in the package is brightest in the normal direction. The light at the two sides of the normal direction is symmetrically distributed. Since the hanging point generally is at a certain height, the viewer needs to look up to see the display. In the case that the display is at a certain height, based on the law plane, the light from the display in the lower half is effective light and most of the light in the upper half is not actually needed. Therefore, most of the energy is wasted and light pollution is caused.

In order to meet the viewing brightness standards of pedestrians looking up at the display and to improve the viewing angle range, it is necessary to provide an LED support frame and LED devices and LED display modules manufactured with the same to solve the above defects.

SUMMARY OF THE INVENTION

An object of the present invention is to provide an LED support frame, an LED device and an LED display module manufactured with the same, which can meet the viewing brightness standard of pedestrians looking up at the display and improve the viewing angle range.

The present invention adopts the following technical solutions to achieve the above object.

An LED support frame includes a substrate and a reflector cup arranged on the substrate, characterized in that a light converging component is provided on an upper surface of the reflector cup, and a concave light converging surface is provided on a side surface of the light converging component adjacent to a cup rim of the reflector cup.

Preferably, the light converging surface is covered with a reflective material layer.

Preferably, the light converging surface is a smooth curved surface or a plan.

Preferably, the light converging component is located on at least one side of the upper surface of the reflector cup, and the light converging component is integrally formed with the reflector cup.

Preferably, the upper surface of the reflector cup has a square or hexagonal shape.

Preferably, the light converging component includes a first light converging component and a second light converging component integrally formed with the first light converging component.

Preferably, the first light converging component is located on one side of the reflector cup, and the upper surface of the first light converging component is parallel to the upper surface of the reflector cup; the second light converging component is located on two sides of the first light converging component and is formed by a side of the reflector cup provided with the first light converging component extending towards two adjacent sides; and the second light converging component covers at least part of said two adjacent sides.

Preferably, the surface of the second light converging component is a vertical plane, a bevel or a curved surface.

Preferably, an included angle formed by a surface of the second light converging component and the upper surface of the reflector cup is in the range of 90° to 120°.

Preferably, the first light converging component and the second light converging component form a concave light converging surface on the side where the cup rim of the reflector cup is disposed.

Preferably, an inner wall of the reflector cup includes a first inner wall adjacent to the light converging component and a second inner wall opposite to the first inner wall, the included angle between the first inner wall and a cup bottom of the reflector cup is in the range of 90° to 120°, and the included angle between the second inner wall and the cup bottom of the reflector cup is in the range of 120° to 135°.

An LED device includes an LED support frame, an LED chip disposed on the LED support frame, and an encapsulant gel covering the LED chip.

An LED display module made based on the LED device includes a circuit substrate, a plurality of spaced-apart LED devices mounted on the circuit substrate, and potting adhesive filled in the areas between the LED devices.

Compared with the prior art, the beneficial effects of the present invention are as follows:

1. By disposing the light converging component on the upper surface of the LED support frame and thus a concave light converging surface having the function of converging light being formed on the side where the cup rim of the reflector cup is disposed, light emitted by the LED chip is reflected back upon reaching the light converging surface of the light converging component and then converged in the visual field observed by the observer. Therefore, light loss in the direction in which the light converging component is provided is effectively reduced and light utilization is improved.

2. By covering the light converging surface of the light converging component with a reflective layer and thus a reflective layer being formed, the light emitted from the LED chip is reflected by the reflective material on the light converging surface of the light converging component, and is then converged in the visual field of the observer, thereby effectively enhancing intensity of the visible light, reducing light pollution and further improving light utilization of LED devices.

3. When the LED device is used for the LED display module, the installation direction of the light converging component can be selected according to the actual needs, so that the light in the direction in which light is not required is reflected to the direction in which light can be effectively utilized, and light emitted by the LED display module can be effectively used.

DETAILED DESCRIPTION OF ILLUSTRATED EMBODIMENTS

In order to enable those skilled in the art to better understand the technical solutions of the present invention, the present invention is further described in detail below with reference to the accompanying drawings and preferred embodiments.

Support Frame Example One

Figure 1:
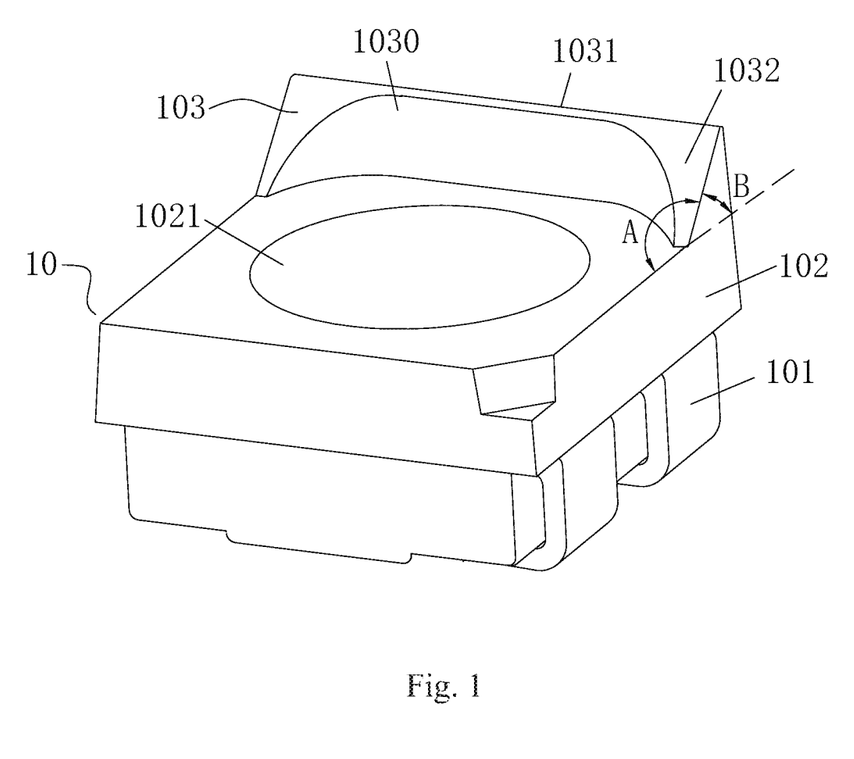
FIG. 1 is a perspective view of a first embodiment of the LED support frame of the present invention.

As shown in FIG. 1, an LED support frame 10 includes a substrate 101 and a reflection cup 102 disposed on the substrate 101. A light converging component 103 is disposed on an upper surface of the reflection cup 102. A side surface of the light converging component 103 adjacent to the cup rim 1021 of the reflector cup 102 is provided with a concave light converging surface 1030. After the subsequent encapsulation of the LED support frame is completed, a part of the light emitted by the LED chip is emitted toward the light converging surface 1030, reflected by the light converging surface 1030, and converges with light emitted by LED chips.

The material of the reflector cup 102 may be engineering resin, specifically may be one of polyphthalamide resin (PPA), polymethylmethacrylate (PMMA), polyamide (PA), polycarbonate (PC), polyoxymethylene (POM) and polybutylene terephthalate (PBT), and preferably is white polyphthalamide resin (PPA).

The cup rim 1021 of the reflector cup 102 may be arranged in a square, a circle, an ellipse, or an irregular pattern. The upper surface of the reflector cup 102 may be a square or a hexagon, although the upper surface is shown square in the drawings.

The light converging component 103 is located on at least one side of the upper surface of the reflector cup 102. In this embodiment, the upper surface of the reflector cup is square-shaped, and the light converging component 103 is located on at least one side of the square-shaped upper surface of the reflector cup and is formed integrally with the reflector cup 102. The light converging component 103 includes a first light converging component 1031 and a second light converging component 1032 integrally formed with the first light converging component 1031. The first light converging component 1031 is located on one side of the reflector cup, and the upper surface of the first light converging component 1031 is parallel to the upper surface of the reflector cup. The second light converging component 1032 is located on two sides of the first light converging component 1031 and is formed by the side of the reflector cup provided with the first light converging component extending towards the two adjacent sides. The second light converging component covers at least part of said two adjacent sides, the surface of which may be a vertical plane, a bevel or a curved surface. A perpendicular plane of the second light converging component is also perpendicular to the upper surface of the reflector cup. An included angle A formed by the surface of the second light converging component and the upper surface of the reflector is in the range of 90° to 120°. When the surface of the second light converging component is a curved surface, the included angle A is an included angle formed by a plane tangent to the surface and the upper surface of the reflector cup. In this embodiment, the surface of the second light converging component is a bevel, and the angle A formed by the bevel and the upper surface of the reflector cup is in a range of 90° to 120°. The first light converging component and the second light converging component form a concave light converging surface on the side where the cup rim of the reflector cup is disposed.

The included angle B in FIG. 1 is the supplementary angle of the included angle A. According to the research by the inventor, when the included angle A is in the range of 90° to 120°, the light loss is lowest, which can effectively save energy, and under this condition the observer may have the best observation.

There are many implementations for the shape of the concave light converging surface 1030 formed by the light converging component on the side where the cup rim of the reflector cup is disposed, such as a concave smooth curved surface or flat surface. In this embodiment, as shown in FIG. 1, a concave smooth curved surface is adopted. The light converging component and the upper surface of the support frame may be vertically distributed or may be deviated by a certain angle with respect to the perpendicular direction of the upper surface of the support frame. By adjusting the angular deviation of the light converging component from the perpendicular direction of the upper surface of the support frame, the light emitting angle of the LED device can be adjusted.

The upper surface of the LED support frame is provided with a light converging component. When the LED support frame is used for a LED device, since the surface formed by the light converging component on the side where the cup rim of the reflector cup is disposed is a concave light converging surface, the concave light converging surface has a condenser effect, whereby the light emitted by the LED chip is reflected back upon reaching the light converging surface of the light converging component, and then gathered in the visual field of the observer, effectively reducing light loss in the direction in which the light converging component is provided and improving light utilization.

Bracket Example II

Figure 2:
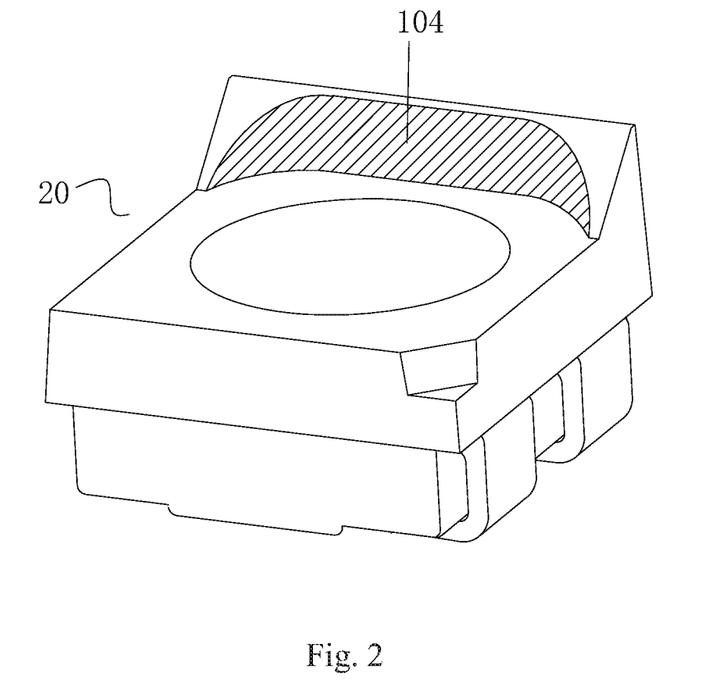
FIG. 2 is a perspective view of a second embodiment of the LED support frame of the present invention.

As shown in FIG. 2, an LED support frame 20 in this embodiment is similar to the first embodiment except that a concave light converging surface of the light converging component is covered with a reflective material layer 104 to form a reflective layer. The light emitted by the LED chip is reflected by the reflective material layer 104 on the light converging surface of the light converging component and then converged in the visual field observed by the observer, thus effectively increasing light intensity of the visible part, reducing light pollution and further improving light utilization.

Bracket Example Three

Figure 3:
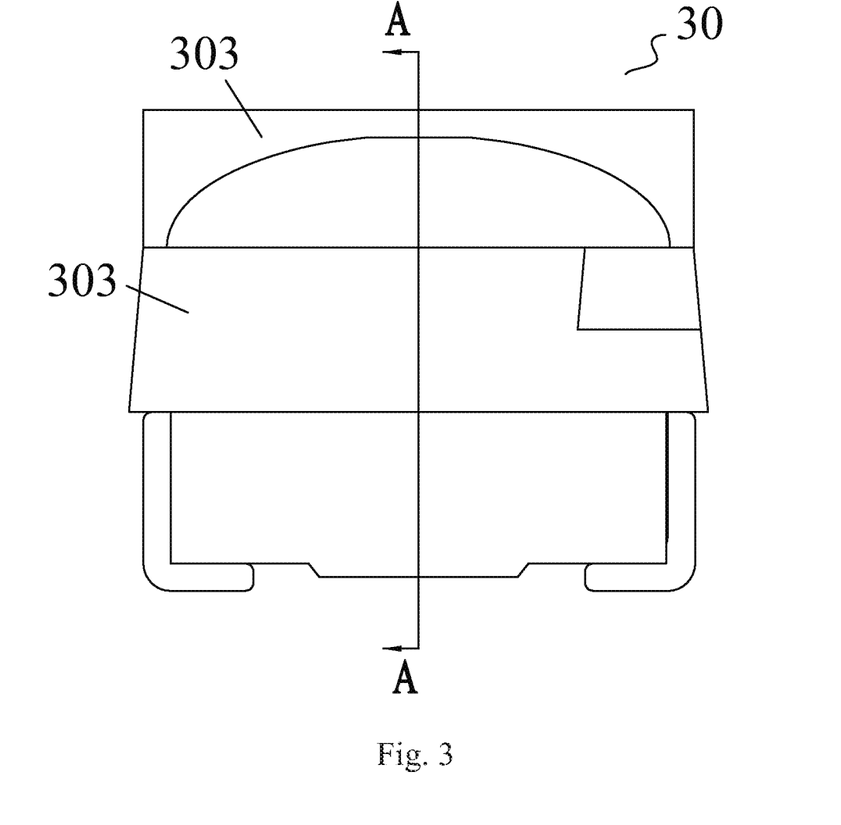
FIG. 3 is a schematic view of the front structure of a third embodiment of the LED support frame of the present invention.
Figure 4:
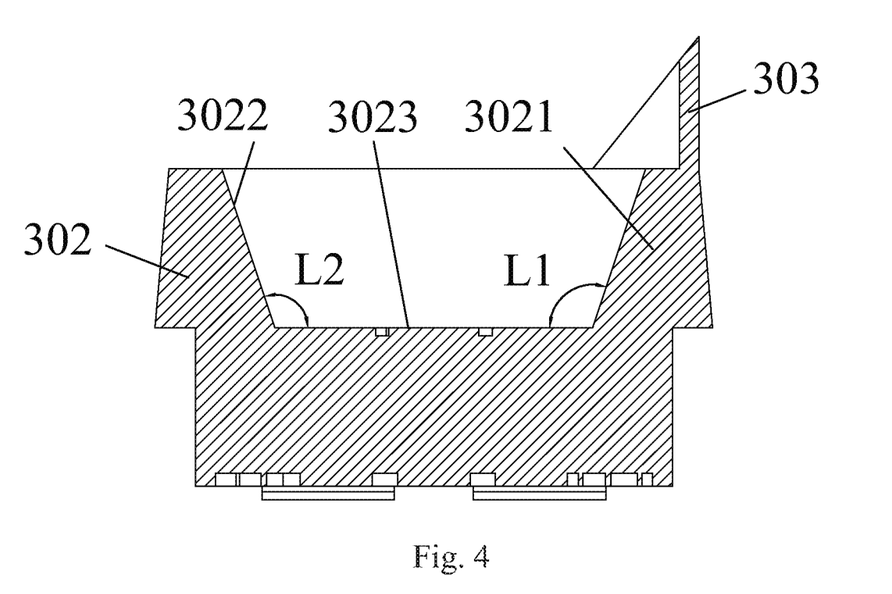
FIG. 4 is a cross-sectional view taken along A-A direction of FIG. 3.

As shown in FIG. 3 and FIG. 4, an LED support frame 30 in this embodiment is similar to the first embodiment except that the inner wall of the reflector cup 302 is defined in this embodiment.

Specifically, an inner wall of the reflector cup 302 includes a first inner wall 3021 adjacent to the light converging component 303 and a second inner wall 3022 opposite to the first inner wall 3021. The included angle L1 between the first inner wall 3021 and the cup bottom 3023 of the reflector cup 302 is in the range of 90° to 120°, and the included angle L2 between the second inner wall 3022 and the cup bottom 3023 of the reflector cup 302 is in the range of 120° to 135°. When the included angle L2 increases, suitably reducing the included angle L1 causes the light to be reflected back upon reaching the first inner wall 3021 of the reflector cup 302 where the light converging component 303 is disposed and then converged in the visual field observed by the observer, thereby increasing light utilization.

Device

This embodiment provides an LED device fabricated based on the LED support frame described in the above LED support frame embodiment.

An LED device provided in this embodiment includes an LED support frame, an LED chip disposed on metal pins of the LED support frame, and an encapsulant gel covering the LED chip.

The LED chip is one or three of an ultraviolet chip, a blue chip, a green chip or a red chip, preferably a combination of red, green and blue chips.

The encapsulant gel is epoxy resin or silica gel. In this embodiment, the encapsulant gel is preferably mixed with scattering particles.

According to the LED device provided in this embodiment, most of the light emitted from the LED chip is emitted through the encapsulant gel since a light converging component is disposed on the upper surface of the LED device, and a part of the light is reflected by the concave light converging surface of the light converging component and then converged in an opposite direction to the direction in which to the light converging component is provided, thereby effectively reducing light loss in the direction in which the light converging component is disposed and increasing light utilization in the opposite direction to the direction in which the light converging component is disposed and thus further enhancing light intensity of the LED device.

Display Module

This embodiment provides an LED display module manufactured based on the LED device described in the above LED device embodiment.

Figure 5:
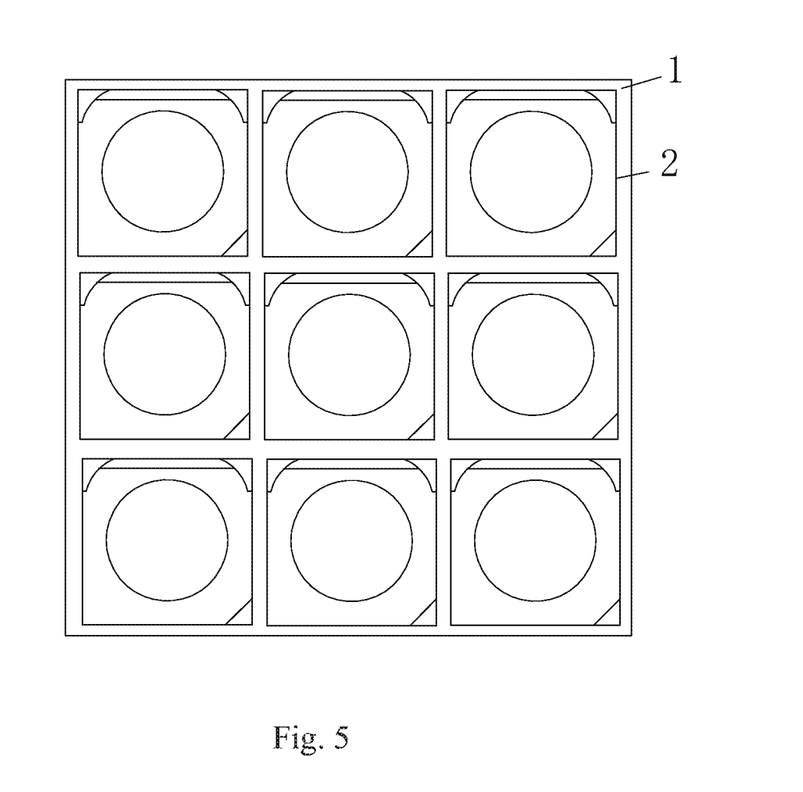
FIG. 5 is a schematic top view corresponding to the LED display module of the present invention.

As shown in FIG. 5, the LED display module provided in this embodiment includes a circuit substrate 1, a plurality of spaced-apart LED devices 2 mounted on the circuit substrate 1, and potting adhesive filled in the areas between the LED devices.

When the LED device is used for the LED display module, the installation direction of the light converging component can be selected according to the actual needs, so that the light in the direction in which light is not required is reflected to the direction in which light can be effectively utilized, and light emitted by the LED display module can be effectively used. In this embodiment, the LED display module is installed at a high position outdoors, and the upward light emitted by the LED device cannot be effectively utilized otherwise. For this purpose, the light converging component in this embodiment is disposed above the LED device. Since the upper surface of the reflector cup of the LED device is provided with the light converging component, the upward light and part of the leftward and rightward light emitted by the LED device are reflected upon reaching the light converging surface of the light converging component and thus are effectively utilized. Light loss of the upward light and part of the leftward and rightward light emitted by the LED device is reduced, light utilization is increase and thus the viewer is enabled to receive more intense light at the viewing position (ie below the LED display module).

Compared with the prior art, the beneficial effects of the present invention are as follows:

1. By disposing the light converging component on the upper surface of the LED support frame and thus a concave light converging surface having the function of converging light being formed on the side where the cup rim of the reflector cup is disposed, light emitted by the LED chip is reflected back upon reaching the light converging surface of the light converging component and then converged in the visual field observed by the observer. Therefore, light loss in the direction in which the light converging component is provided is effectively reduced and light utilization is improved.

2. By covering the light converging surface of the light converging component with a reflective layer and thus a reflective layer being formed, the light emitted from the LED chip is reflected by the reflective material on the light converging surface of the light converging component, and is then converged in the visual field of the observer, thereby effectively enhancing intensity of the visible light, reducing light pollution and further improving light utilization of LED devices.

3. When the LED device is used for the LED display module, the installation direction of the light converging component can be selected according to the actual needs, so that the light in the direction in which light is not required is reflected to the direction in which light can be effectively utilized, and light emitted by the LED display module can be effectively used.

While the invention has been described in connection with what are presently considered to be the most practical and preferred embodiments, it is to be understood that the invention is not limited to the disclosed embodiments, but on the contrary, is intended to cover various modifications and equivalent arrangements included within the spirit and scope of the invention.

What is claimed is:

1. An LED support frame, comprising a substrate and a reflector cup arranged on the substrate, characterized in that a light converging component is provided on an upper surface of the reflector cup, and a concave light converging surface is provided on a side surface of the light converging component adjacent to a cup rim of the reflector cup; wherein the light converging component includes a first light converging component and a second light converging component integrally formed with the first light converging component; the first light converging component is located on one side of the reflector cup, and the upper surface of the first light converging component is parallel to the upper surface of the reflector cup; the second light converging component is located on two sides of the first light converging component and is formed by a side of the reflector cup provided with the first light converging component extending towards two adjacent sides; and the second light converging component covers at least part of said two adjacent sides;

an inner wall of the reflector cup includes a first inner wall adjacent to the light converging component and a second inner wall opposite to the first inner wall, an included angle L1 between the first inner wall and a cup bottom of the reflector cup is in the range of 90° to 120°, and an included angle L2 between the second inner wall and the cup bottom of the reflector cup is in the range of 120° to 135°; when the included angle L2 increases, the included angle L1 is reduced in order for light to be reflected back upon reaching the first inner wall of the reflector cup where the light converging component is disposed and then converged in the visual field observed by the observer.

2. The LED support frame according to claim 1, characterized in that the light converging surface is covered with a reflective material layer.

3. The LED support frame according to claim 1, characterized in that the light converging surface is a smooth curved surface or a plane.

4. The LED support frame according to claim 1, characterized in that the light converging component is integrally formed with the reflector cup.

5. The LED support frame according to claim 4, characterized in that the upper surface of the reflector cup has a square or hexagonal shape.

6. The LED support frame according to claim 1, characterized in that the surface of the second light converging component is a vertical plane, a bevel or a curved surface.

7. The LED support frame according to claim 1, characterized in that an included angle formed by a surface of the second light converging component and the upper surface of the reflector cup is in the range of 90° to 120°.

8. The LED support frame according to claim 1, characterized in that the first light converging component and the second light converging component form a concave light converging surface on the side where the cup rim of the reflector cup is disposed.

9. An LED device, comprising an LED support frame, an LED chip disposed on the LED support frame, and an encapsulant gel covering the LED chip, characterized in that the LED support frame is the LED support frame according to claim 1.

10. An LED display module manufactured based on the LED device according to claim 9, comprising a circuit substrate, a plurality of spaced-apart LED devices mounted on the circuit substrate, and potting adhesive filled in the areas between the LED devices.

* * * * *